US010541678B2

(12) United States Patent
Bemat et al.

(10) Patent No.: US 10,541,678 B2
(45) Date of Patent: Jan. 21, 2020

(54) LOAD TO CONFORM TO A PARAMETER

(71) Applicant: Hewlett Packard Enterprise Development LP, Houston, TX (US)

(72) Inventors: Mohamed Amin Bemat, Cypress, TX (US); Daniel Humphrey, Tomball, TX (US); Stewart Gavin Goodson, II, Houston, TX (US); Michael Delany, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 135 days.

(21) Appl. No.: 15/919,551

(22) Filed: Mar. 13, 2018

(65) Prior Publication Data
US 2019/0288673 A1 Sep. 19, 2019

(51) Int. Cl.
*H03K 3/017* (2006.01)
*G05B 13/02* (2006.01)
*H03K 17/687* (2006.01)

(52) U.S. Cl.
CPC ........... *H03K 3/017* (2013.01); *G05B 13/024* (2013.01); *H03K 17/687* (2013.01)

(58) Field of Classification Search
CPC .... H03K 3/017; H03K 17/687; G05B 13/024; G05B 13/02
See application file for complete search history.

(56) References Cited

U.S. PATENT DOCUMENTS

| 8,242,629 | B2 | 8/2012 | Palatini et al. |
| 2005/0134248 | A1 | 6/2005 | Locker et al. |
| 2007/0126449 | A1 | 6/2007 | Ou et al. |
| 2016/0118896 | A1 | 4/2016 | Walker et al. |

FOREIGN PATENT DOCUMENTS

| CN | 102455414 | 5/2012 |
| CN | 104569680 | 4/2015 |

OTHER PUBLICATIONS

IntePro Systems; "High Speed Electronic DC Loads"; printed from: https://www.inteproate.com/wp-content/uploads/2016/08/EL-2000-HS-1.3.pdf on Sep. 20, 2017; 7 pages.

*Primary Examiner* — Robert L Deberadinis
(74) *Attorney, Agent, or Firm* — Brooks, Cameron & Huebsch, PLLC

(57) ABSTRACT

An example system includes a control interface and a device coupled to the control interface. The control interface may generate a parameter. The device may receive the parameter from the control interface, generate a switching waveform and current reference, adjust the switching waveform to generate an output current, and adjust the output current by using an error amplifier to provide an output current that conforms to at least one parameter.

20 Claims, 4 Drawing Sheets

LOAD TO CONFORM TO A PARAMETER

BACKGROUND

Point of load (POL) converters may be included in consumer electronics equipment to serve as linear or DC-DC converters. POL converters may be tested for their ability to respond to various parameters such as high slew rate loads, dynamic load conditions, and/or high load switching frequencies. POL converters may be tested using automated testing equipment (ATE).

DETAILED DESCRIPTION

Figure 1:
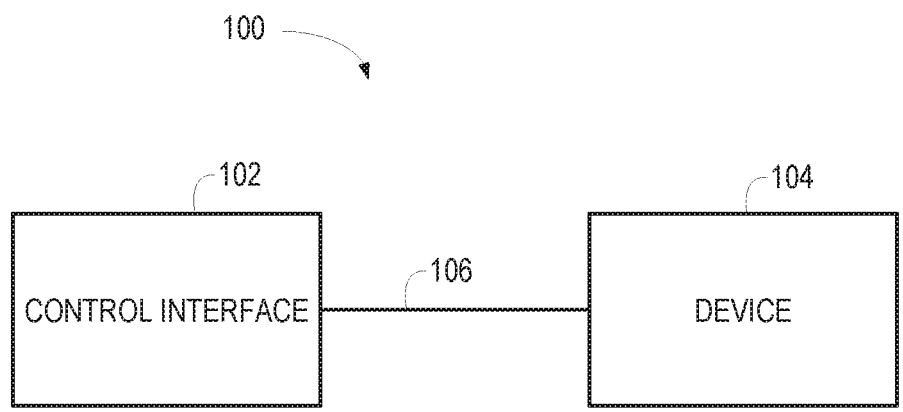
FIG. 1 illustrates an example of a system for a load to conform to a parameter.

One type of point of load (POL) converter is a DC-to-DC electric power converter. DC-to-DC converters are electric circuits or electro-mechanical devices that convert a source of DC power from one voltage level to another. Electronic devices such as cellular phones, laptop computers, tablets, phablets, and smartphones, as well as Internet-of-Things (IoT) enabled devices may use POL converters to regulate voltage signals different components receive from their respective power supplies, or to regulate multiple voltage signals generated by a single power supply coupled to multiple components of an electronic device.

As used herein, the term "IoT enabled devices" can, for example, refer to physical devices, vehicles, home appliances, and other devices embedded with electronics, software, sensors, actuators, and/or network connectivity which enables such devices to connect to a network and/or exchange data. Examples of IoT enabled devices include wearable technologies, smart home devices, intelligent shopping systems, and monitoring devices, among other cyber-physical systems. In addition, electronic devices may include one or more processing resources to execute instruction such as instruction corresponding to an operating system to provide common services for applications running on the computing system. Examples of operating systems include Linux®, Unix®, Windows®, etc.

As an example, POL converters may regulate one or more voltages corresponding to sub-circuits in electronic devices that may each have their own voltage level requirements that may be different from the voltage supplied by an external power source such as a power supply or battery.

Due to the disparate voltage requirements of component and/or sub-circuits used in electronic devices, POL converters may be tested for their ability to respond to various parameters. For example, POL converters may be tested for their ability to respond to high slew rate loads, dynamic load conditions, and/or their ability to operate at relatively high load switching frequencies. Because POL converters may respond to such parameters with precision and/or accuracy, testing of POL converters may allow for quality control, identification of potential faults, and/or troubleshooting to verify the precision and/or accuracy of the POL converter.

Some approaches to POL converter testing may involve the use of automated testing equipment (ATE). However, ATE may be costly, cumbersome, and/or may be difficult to tailor to particular applications and/or varying testing conditions. For example, some approaches to POL testing that utilize ATE may be custom built for a particular purpose and may not provide adequate test results under varying conditions. Other approaches to POL converter testing that utilize ATE may be unable to handle the combination of high load switching frequency, high load current, and/or high slew rate that may be present in some applications.

As used herein, the term "automated testing equipment" can, for example, refer to apparatuses and/or systems that perform tests on a device (e.g., a device under test (DUT)), using automation to perform measurements as part of a testing operation and evaluate the measurements as part of the testing operation. For example, ATE can use electronic test equipment to generate signals (e.g., signals used in performance of a testing operation) and receive responses based on the generated signals from electronic DUTs. This may facilitate testing of a DUT to evaluate the functionality of the DUT and/or or trace faults in a DUT that is not functioning properly.

In contrast, examples herein may allow for a device under test such as a POL converter to have testing operations performed thereon in the absence of ATE. In some examples, this may allow for a device under test to be evaluated under varying conditions and/or across multiple applications without custom building and/or manufacturing specific ATEs for particular testing applications. In addition, some examples described herein may allow for POL converter testing to be modularized, scaled, and/or performed quickly and/or efficiently in the absence of ATE.

The figures herein follow a numbering convention in which the first digit corresponds to the drawing figure number and the remaining digits identify an element or component in the drawing. Similar elements or components between different figures may be identified by the use of similar digits. For example, 102 may reference element "02" in FIG. 1, and a similar element may be referenced as 302 in FIG. 3. Elements shown in the various figures herein can be added, exchanged, and/or eliminated so as to provide a number of additional examples of the disclosure. In addition, the proportion and the relative scale of the elements provided in the figures are intended to illustrate the examples of the disclosure and should not be taken in a limiting sense.

FIG. 1 illustrates an example system 100 for a load to conform to a parameter consistent with the disclosure. As used herein, the term "load" can, for example, refer to an electrical component that consumes electric power (in contrast with a power source, which produces power). In some examples, the load may affect the performance of circuits associated with the system 100 with respect to output voltages and/or currents.

As shown in FIG. 1, the system 100 includes a control interface 102 and a device 104. In some examples, the control interface 102 may be a serial peripheral interface bus (SPI) that can provide communication between the device 102 and the control interface 102. An example of a control interface is a National Instruments SPI bus (e.g., an NI USB-8452 SPI control interface); however, examples are not limited to specific protocols, brands, and/or model numbers of control interfaces, and the control interface 102 may be any suitable control interface that provides communication between the control interface 102 itself and the device 104.

In some examples, the control interface 102 and the device 104 are coupled via a communication link 106. As used herein, the term "control interface" can, for example, refer to a device that is used to transfer data in and out of a component of a system. In some example, the control interface may transfer data to a load board (e.g., system 401 illustrated in FIG. 4, herein). As used herein, the term "load board" can, for example, refer to a substrate on which one or more integrated circuit sockets and/or integrated test circuits are mounted. The load board may generate signals as part of a testing operation (e.g., a testing operation involving a DUT), as described in more detail in connection with FIG. 4, herein.

The load board may include a microprocessor (e.g., microprocessor 408 illustrated in FIG. 4) that receives data from the load board and generates a waveform based on the parameters contained in the data. The parameters contained in the data may include slew rates, current amplitudes, load switching frequencies, and/or duty cycles.

The control interface 102 may generate a set of parameters and transmit, via the communication link 106, the parameters to the device 104. In some examples, the device 104 may receive the parameters from the control interface 102 and generate a switching waveform (e.g., a signal capable of exhibiting one of two distinct states such as a logical value of "1" and a logical value of "0) and/or a reference current. The device 102 may adjust the switching waveform to generate an output current. In some examples, the device 102 may then use an error amplifier to provide an output current that conforms to at least one parameter, as described in more detail in connection with FIG. 4, herein. The parameters may include a load switching frequency, a load slew rate, a current amplitude, a duty cycle of an output current, or combinations thereof.

As used herein, the term "load switching frequency" can, for example, refer to the rate at which a load switching device is turned on and off. Load switching frequencies utilized in POL converter testing may range from a few kilohertz to a few megahertz. Increased switching frequency may reduce the size of associated components such as the inductors, transformers, and capacitors, which may influence the component selection for an electronic device in terms of physical size, electrical characteristics, frequency response, minimum on-time, and/or power losses, among others.

Figure 4:
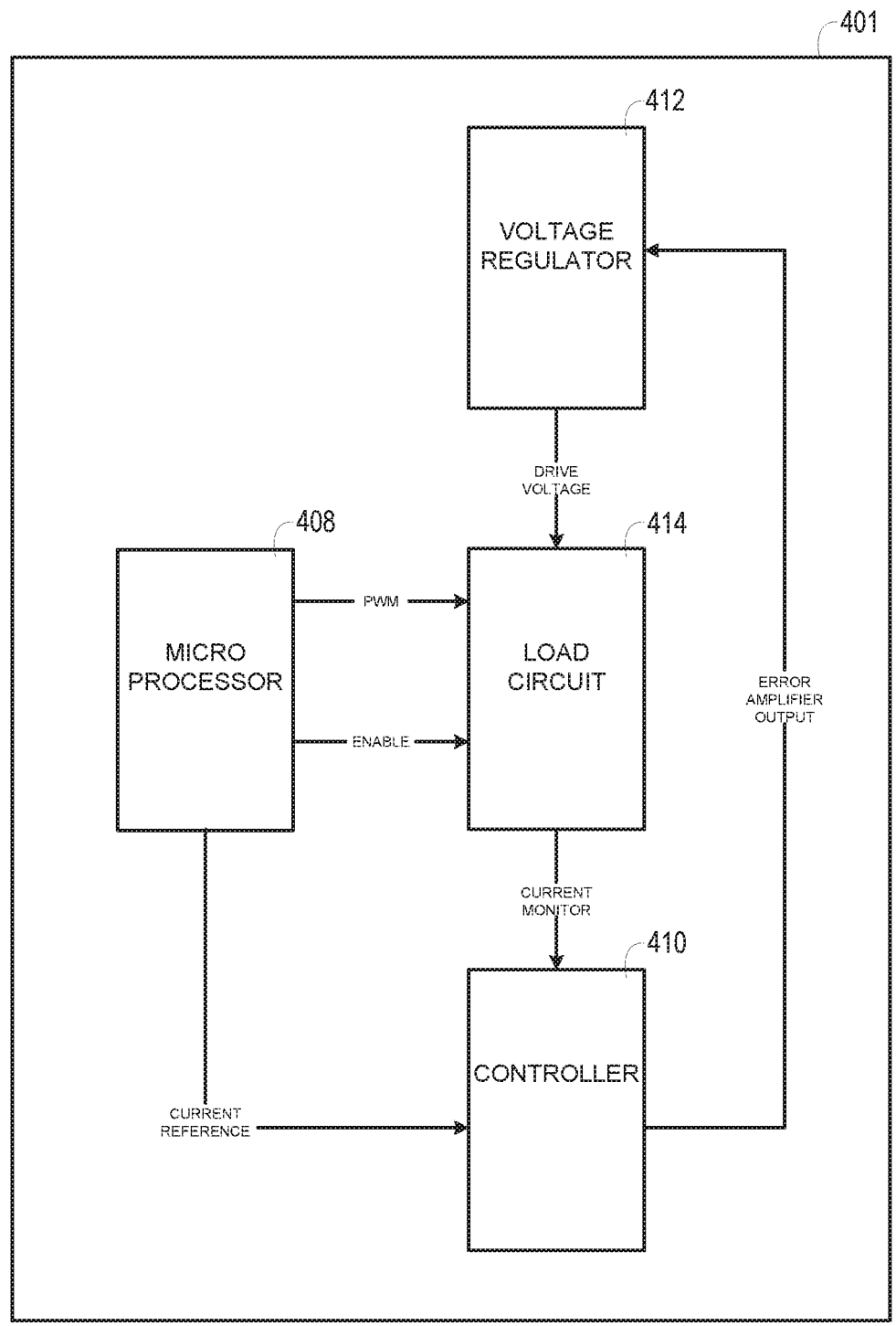
FIG. 4 illustrates an example of an apparatus for a load to conform to a parameter consistent with the disclosure.

In some examples, the slew rate of the system 100 may be based, at least in part, on enabling and disabling load stages and/or adjusting the gate resistance of the switching transistors of the load (e.g., load circuit 414 illustrated in FIG. 4). As used herein, the term "slew rate" can, for example, refer to a change of voltage, current, or any other electrical quantity per unit of time. Some electronic circuits may specify minimum or maximum limits on the slew rates for their inputs or outputs, with these limits valid under some set of given conditions. In such examples, for a given output of a circuit, such as an amplifier, the slew rate specification may guarantee that the speed of the output signal transition will be at least the given minimum, or at most the given maximum. However, when applied to the input of a circuit, the slew rate specification may instead indicate that the external driving circuitry should meet those limits in order to facilitate correct operation of the receiving device. If these limits are violated, some error might occur, and correct operation of the receiving device may no longer be guaranteed.

The duty cycle of the system 100 may be based, at least in part, on a pulse width modulation (PWM) output from a microprocessor (e.g., microprocessor 208 illustrated in FIG. 2 and described in greater detail in connection with FIG. 2, herein). The duty cycle may be modified by the microcontroller when generating a switching reference (e.g., a reference current or voltage at which one or more circuit components of the system 100 change their state, for example, from an "off" state to an "on" state). As used herein, the term "duty cycle" can, for example, refer to a percentage of the ratio of pulse duration, or pulse width to the total period of the waveform. The PWM may be used to represent time duration of a pulse when it is high. Alternatively stated, a duty cycle may be the fraction of one period in which a signal or system is active. The duty cycle may be expressed as a percentage or a ratio, while a period may be the time it takes for a signal to complete an on-and-off cycle.

Pulse-width modulation is a modulation technique that may be used to encode a message into a pulsing signal. Although this modulation technique can be used to encode information for transmission, PWM may be used to allow the control over an amount of power supplied to electrical devices. In some examples, the average value of voltage, and current, fed to the load may be controlled by turning the switch between supply and load on and off at a fast rate. The longer the switch is on compared to the off periods, the higher the total power supplied to the load.

The PWM switching frequency may be much higher than what would affect the load (e.g., the device that uses the power), which is to say that the resultant waveform perceived by the load may be as smooth as possible. The rate (or frequency) at which the power supply switches can vary greatly depending on load and application. PWM may be used to reduce an amount of power loss in switching devices. For example, when a switch is off there may be practically no current flowing through the switch, and when the switch is on and power is being transferred to the load, there may be almost no voltage drop across the switch. Power loss, being the product of voltage and current, is thus in both cases close to zero in this example. In some examples, PWM may be controlled with digital controls, which, because of their binary nature (e.g., "on/off" nature), can set an operational duty cycle.

In some examples, the current amplitude of system 100 may be based, at least in part, on a reference voltage output of the microcontroller. For example, during operation of the system 100, the microcontroller may output a reference current (illustrated in FIG. 4, herein), and the amplitude of that reference current signal may be referred to as the current amplitude. In some examples, the current amplitude can refer to a measure of the change in current over a period of time.

Figure 3:
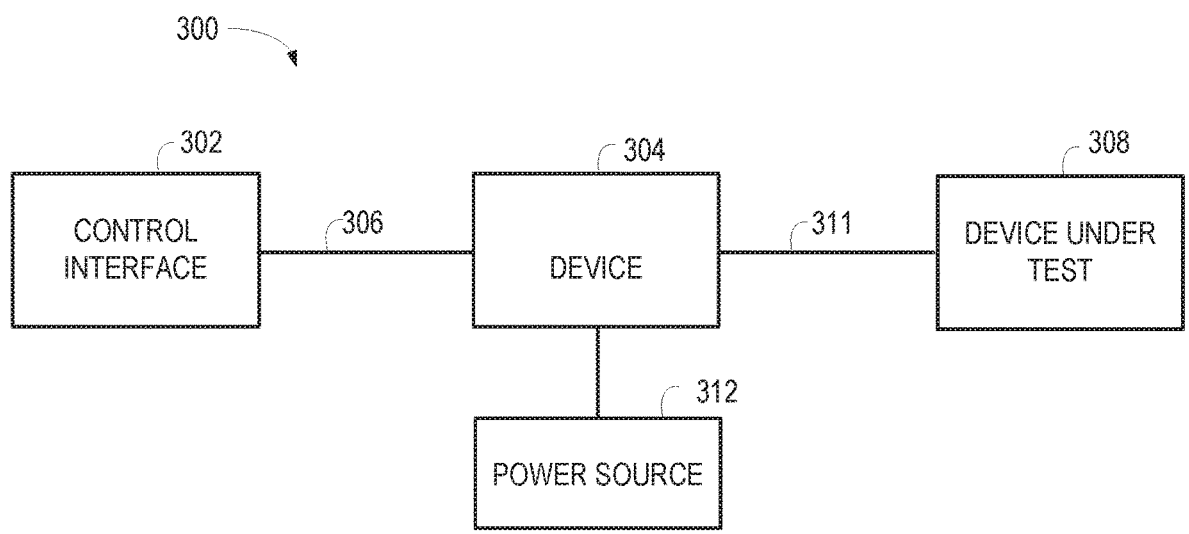
FIG. 3 illustrates an example of a system for a load to conform to a parameter consistent with the disclosure.

The device 104 may output the load to a DUT (e.g., DUT 308 illustrated in FIG. 3, herein). In some examples, the DUT may be powered on prior to receiving the output from the device 104. This may allow the device 104 to test how a DUT responds to a variety of parameters without having to turn the DUT off and/or power cycle the DUT between tests. Examples are not so limited, however, and in some examples, the device 104 may output the load to a DUT that is turned off prior to receiving the output load from the device 104. The output load from the device 104 may initialize the DUT as described in connection with FIG. 4, herein, and allow the device 104 to test the DUT as the output load is flowing through the DUT.

Figure 2:
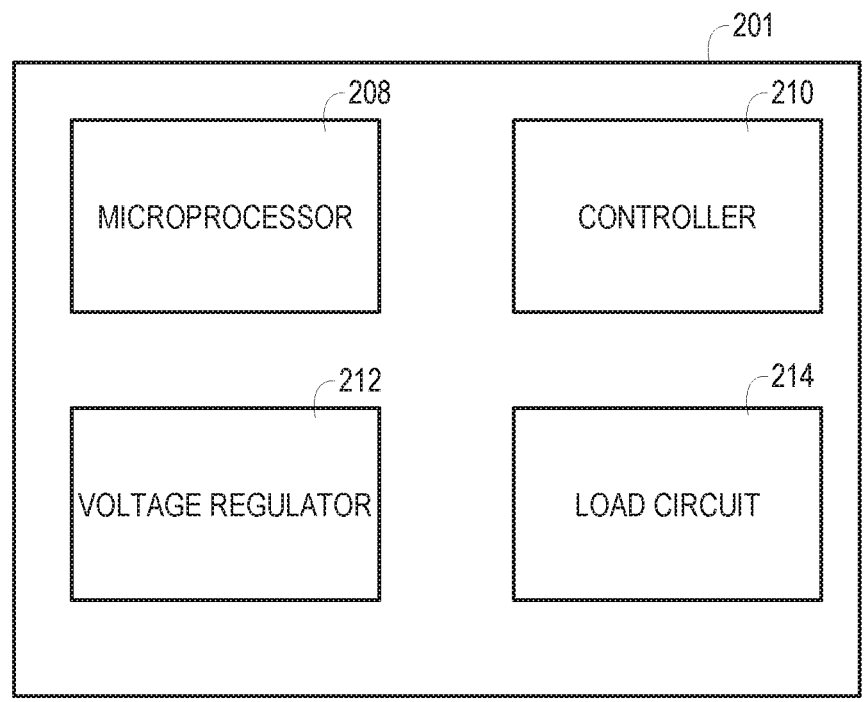
FIG. 2 illustrates an example of an apparatus for using a load control for a load to conform to a parameter.

FIG. 2 illustrates an example of an apparatus 200 for using a load control for a load to conform to a parameter consistent with the disclosure. The apparatus 201 may include a microprocessor 208, a controller 210, a voltage regulator 212, and a load circuit 214. In some examples, the microprocessor 208 may communicate with a control interface (e.g., control interface 102 illustrated in FIG. 1) to receive the parameters the load output will conform to. The controller 210 may receive a current reference from the microprocessor 208 and/or a plurality of current monitoring signals from one or more load circuits 214. An adjustable voltage regulator 212 may provide a gate voltage level for a field effect transistor (FET) in a load circuit 214. In some examples, the apparatus 201 may output a load to conform with at least one parameter.

As used herein, the term "microprocessor" (e.g., microprocessor 208) can, for example, refer to a computer processor which incorporates the functions of a computer's central processing unit onto one or more integrated circuits. Non-limiting examples of integrated circuits include application specific integrated circuits (ASICs), field programmable gate arrays (FPGAs), etc. In some examples, the microprocessor 208 may be a multipurpose, clock driven, register based, digital-integrated circuit which accepts binary data as input, processes it according to instructions stored in its memory, and provides results as output.

In some examples, the microprocessor 208 may generate a PWM signal. The microprocessor 208 may also generate multiple loads and/or a slew rate. After generating the loads and/or the slew rate, the microprocessor 208 may generate a reference current based on the amount of current associated with the loads and/or the slew rate. In some examples, the microprocessor 208 may transmit the reference current to the controller 210.

The controller 210 may be included in a single integrated circuit (e.g., an application specific integrated circuit, field programmable gate array, etc.) which may be dedicated to performing one or more tasks and execute one or more specific applications. The controller 210 may contain memory resources, programmable input/output peripherals, and/or one or more processing resources. In some examples, the controller 210 may sum and/or average current monitoring signals from multiple loads. If the current does not match the reference current, the controller may output an error signal. The controller 210 may control the current monitoring signals to the current reference by amplifying that error output. The amplified error output from the controller 210 may control an output voltage of the adjustable voltage regulator 212, as described in more detail in connection with FIG. 4, herein.

A voltage regulator such as the adjustable voltage regulator 212, may be an electronic circuit that provides a stable DC voltage independent of the load current, temperature and/or input voltage variations. The adjustable voltage regulator 212 may adjust a gate voltage level (e.g., a voltage input at a gate region of a FET) for a FET in the load circuit 214. In some examples, the adjustable voltage regulator 212 may adjust the voltage input to the gate region of the FET based on an amplified error signal generated by the controller 210.

In some examples, the gate voltage level adjusted by the adjustable voltage regulator 214 may be increased or decreased based on a determination that an amount of current corresponding to the amplified error output by the controller 210 is higher or lower than an amount of current supplied by the microprocessor 208. For example, if the amplified error output is lower than the amount of current supplied by the microprocessor 208, the adjustable voltage regulator 212 may provide an increased voltage signal. If the amplified error output is higher than the amount of current supplied by the microprocessor 208, the adjustable voltage regulator 212 may provide a decreased voltage signal.

The load circuit 214 may include a current path that includes an enable FET, a current sense resistor (e.g., a current sense amplifier or current shunt amplifier), and a switching FET, as described in more detail in connection with FIG. 4, herein. In some examples, the current sense resistor may provide current monitor signal outputs to the controller 210. The enable FET may be controlled by input from the microprocessor 208 and the switching FET may be controlled by the PWM (e.g., PWM illustrated in FIG. 4, herein) from the microprocessor 208, as described in connection with FIG. 4, herein.

FIG. 3 illustrates an example of a system 300 for a load to conform to a parameter consistent with the disclosure. System 300 includes a control interface 302, a device 304, a communication link 306, a DUT 308, another communication link 311, and a power source 312 (e.g., a power supply unit). The control interface 302 may generate a set of parameters and transmit them, via a communication link 306, to a device 304. The device 304 may receive the parameters and generate a switching waveform and/or a current reference. The device 304 may adjust the switching waveform to output a current that conforms to the parameters the device 304 received from the control interface 302. The device 304 may transmit that output current, via a communication link 311, to the DUT 308 to test how the DUT 308 responds to the output current, for example, as part of a testing operation performed on the DUT 308.

The DUT 308 may have an output associated therewith coupled to the device 304. In some examples, the device 304 may be a load board. In some examples, test signals may be transferred between the DUT 308 and the device 304 as part of an operation to determine characteristics of the DUT 308.

In some examples, the DUT 308 may be a point of load converter such as a DC-DC point of load converter. In such examples, signals may be transferred, for example, via communication link 311, between the device 304 and the DUT 308 to test and/or analyze characteristics of the DUT 308 as part of a testing operation performed using the DUT 308. For example, signals may be transferred between the device 304 and the DUT 308 to test the DUT 308 to determine if it is operating within certain predefined operational parameters and/or is exhibiting characteristics consistent with predefined operational parameters, such as how the DUT 308 responds to an output current from the device 304.

In some examples, the power source 312 may provide power for the electronics and/or controllers in the device 304. For example, the power source 312 may output one or more voltage signals to provide power to the device 304, the control interface 302, and/or the DUT 308. In some examples, the power source 312 may be a 12-volt power source (e.g., a power source that outputs a 12-volt DC signal to the device 304, the control interface 302, and/or the DUT 308). Examples are not limited to a 12-volt power source; however, and the power source 312 may provide greater than 12-volts or less than 12-volts in some examples. In examples in which a 12-volt power source is provided, the power source 312 may convert the one or more voltage signals into various voltage signals that are lower than 12-volts. For example, the power source 312 may be adjustable to output 5-volt power signals, 3.3-volt power signals, etc.

FIG. 4 illustrates an example of an apparatus 401 for a load to conform to a parameter consistent with the disclosure. The apparatus 401 may include a microprocessor 408, a controller 410, a voltage regulator 412, and a load circuit 414. In some examples, the microprocessor 408 may communicate with a control interface (e.g., control interface 302 illustrated in FIG. 3) to receive the parameters the load output will conform to. In some examples, the apparatus 401 may be a load board.

The controller 410 may receive a current reference from the microprocessor 408 and/or a plurality of current monitoring signals from one or more load circuits 414. The controller 410 may then sum and/or average the current monitoring signals and compare that average to the reference current. If the average of the current monitoring signals does not conform to the current reference, the controller 410 may output an error signal. In some examples, the controller 410 may subsequently amplify the output error signal and/or transfer the amplified error output signal to a voltage regulator (e.g., the adjustable voltage regulator 212 illustrated in FIG. 2).

In some examples, the voltage regulator 412 may receive the amplified error signal and adjust a gate drive voltage level for a field effect transistor in the load circuit 414 based on whether the amplified error signal requests more or less current. For example, if the amplified error output is lower than the amount of current reference supplied by the microprocessor 408, the adjustable voltage regulator 412 may provide an increased voltage signal because an increased voltage signal is requested based on the amplified error output signal. If the amplified error output is higher than the amount of current supplied by the microprocessor 208, the adjustable voltage regulator 212 may provide a decreased voltage signal because a decreased voltage signal is requested based on the amplified error output signal. An example of a voltage regulator 412 may be an adjustable low dropout (LDO) linear voltage regulator, however, examples are not so limited, and the voltage regulator 412 may be any type voltage regulator. In some examples, the apparatus 401 may then output a load to conform with at least one parameter, as described above in connection with FIGS. 1 and 2.

The load circuit 414 may include a current path that includes a switching FET, an enable FET, and/or a current sense resistor. The switching FET may operate to allow a voltage signal to pass through it under some conditions and may stop a voltage signal from passing through it under other conditions. For example, when an input voltage to a gate region of the switching FET is zero (or substantially zero), the switching FET conducts virtually zero current and the output voltage is substantially equal to a supply voltage. As used herein, the term "supply voltage" can, for example, refer to a voltage supplied to a drain region of a FET (e.g., VDD).

In contrast, when the input voltage to the gate region of the switching FET is above a threshold input voltage, the switching FET conducts current and a current at a drain region of the FET increases, thereby reducing the output voltage to zero (or substantially zero). Stated differently, based on the voltage at a gate region of the switching FET, the switching FET may behave similarly to a single-pole single-throw switching device in which a voltage signal either passes through the switch or doesn't pass through the switch based on the magnitude of a voltage signal applied to a gate region of the FET.

The input voltage to the gate region of the switching FET (or enable FET) may refer to an amount of voltage applied to the gate region of the switching FET (or enable FET). This input voltage (e.g., the magnitude of a voltage signal) applied to the gate region of the switching FET may alter a current applied to, or received by, the load circuit 414. For example, the switching FET (or enable FET) may increase or decrease an amount of current supplied to, received by, or transmitted by the load circuit 414 based on a magnitude of the voltage signal applied to the gate region of the switching FET (or enable FET). In some examples, the voltage signal (e.g., a magnitude of the voltage signal) may be determined (or measured) with respect to a source/drain region of the switching FET (or enable FET). For example, the magnitude of the voltage signal may be a magnitude of a voltage differential between a voltage at the gate region of the switching FET (or enable FET) and a source/drain region of the switching FET (or enable FET).

In some examples, the altered current corresponding to the behavior of the switching FET (or enable FET) responsive to the magnitude of the input voltage supplied to the gate region of the switching FET (or enable FET) may alter an amount of current received by the DUT (e.g. DUT 308 illustrated in FIG. 3). For example, the switching FET (or enable FET) may transfer a lower current signal to the DUT when the input voltage is below a particular input voltage threshold and may transfer a higher current signal to the DUT when the input voltage is above the particular voltage threshold. Examples are not so limited, however, and there may be more than one particular input voltage such that there may be multiple input voltages which may each correspond to one or more particular voltage thresholds, which may each correspond to one or more current signals received by the DUT.

The enable FET may operate to enable (or disable) current flow between the load circuit 414 and the controller 410. For example, when the enable FET receives an ENABLE signal from the microprocessor 408, the enable FET may enable the load circuit 414 by allowing the load circuit 414 to be powered on or by indicating to the load circuit 414 that a testing operation is to be initiated. In some examples, the ENABLE signal may cause a voltage signal to be received by a gate region of the enable FET, which may, in turn, allow current to flow through the enable FET thereby enabling the load circuit 414.

In some examples, the switching FET may be controlled by the PWM from the microprocessor 408 and the enable FET may be controlled by an input (e.g., the ENABLE signal) from the microprocessor 408. For example, the switching FET may be enabled or disabled based on the PWM signal from the microprocessor 408, while the enable FET may be enabled or disabled based on the presence or absence of the ENABLE signal form the microprocessor 408.

In some examples, the switching FET and/or the enable FET may be metal-oxide-semiconductor FETs (MOSFETs) such as an N-channel MOSFET; however, examples are not limited to MOSFETs, and the switching FET and/or the enable FET may be other suitable types of FETs such as junction field-effect transistors, metal-nitride-oxide-semiconductor transistors, modulation-doped field effect transistors, dual-gate MOSFETs, etc., or may be other types of transistors or semiconductor devices that are operable to amplify and/or switch electronic signals and/or electrical power signals.

The current sense resistor (e.g., a current sense amplifier or current shunt amplifier) may allow one or more current monitoring signals to be output from the load circuit 414 to the controller 410. For example, the current sense resistor may be disposed in a signal path between the load circuit 414 and the controller 410. In some examples, the current sense resistor may output a voltage that is proportional to an amount of current flowing in a power rail of the load circuit 414. For example, the current sense resistor may receive a current signal applied to the load circuit 414 and convert the current signal to a small voltage signal (e.g., a voltage signal that is smaller than a voltage signal associated with the current signal input to the current sense resistor). The small voltage signal may then be output from the load circuit 414 and received by the controller 410.

Figure 5:
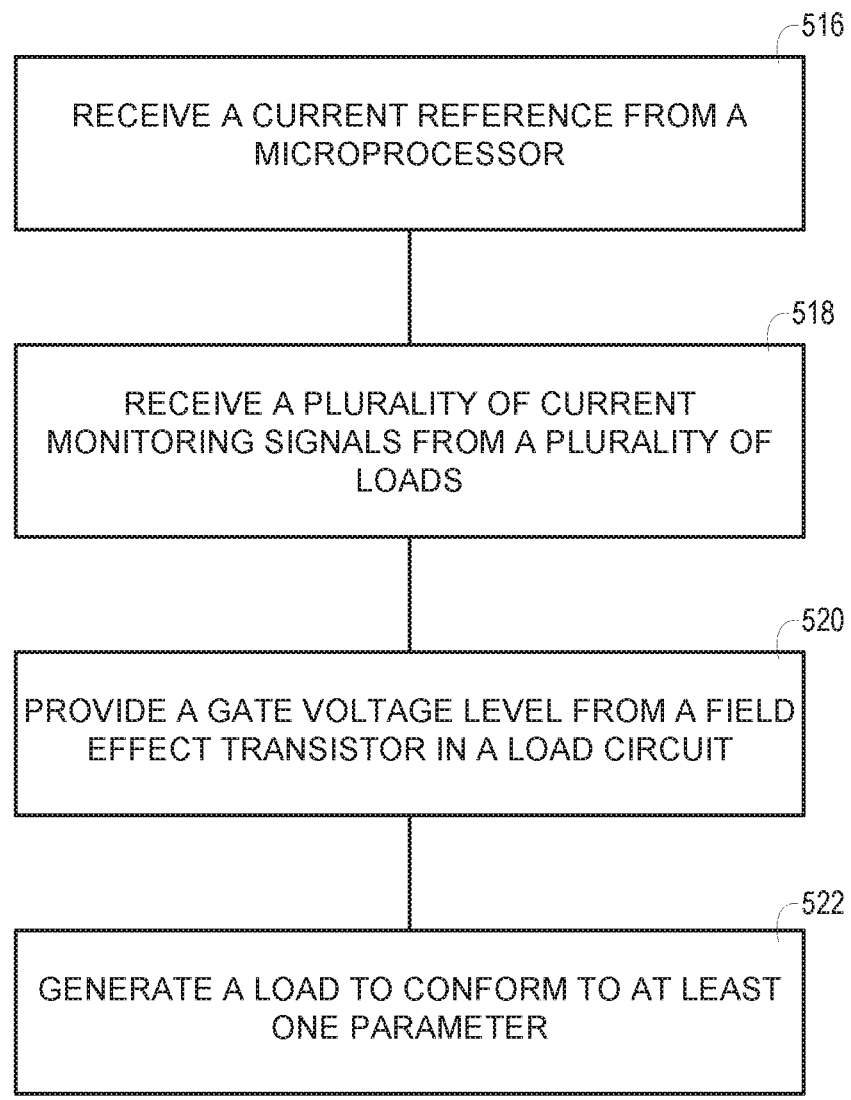
FIG. 5 illustrates an example flow diagram of a method for using load control for a load to conform to a parameter.

FIG. 5 illustrates an example flow diagram of a method for generating a load to conform to a parameter consistent with the disclosure. At block 516, the method may include receiving a current reference from a microprocessor. The microprocessor may be microprocessor 208 illustrated in FIG. 2, herein. In some examples, a controller (e.g., controller 210 illustrated in FIG. 2) may receive a current reference from the microprocessor. In some examples, the microprocessor may then generate a plurality of loads to conform to the at least one parameter.

At block 518, the method may include receiving a plurality of current monitoring signals from a plurality of loads. A controller may receive current monitoring signals from a load circuit (e.g., load circuit 214 illustrated in FIG. 2).

A controller may receive a current monitoring signal for each load generated by the microprocessor. The controller may sum and/or average current signals associated with the loads. If the loads do not match the reference current, the controller may output an error signal. The controller may then amplify that error signal and transmit it to an adjustable voltage regulator. The adjustable voltage regulator may then increase or decrease the gate voltage level of the field effect transistor to adjust the current of the loads in accordance with the reference current.

At block 520, the method may include providing a gate voltage level for a field effect transistor in a load circuit. A load circuit may receive a gate voltage level from an adjustable voltage regulator (e.g., adjustable voltage regulator 212 illustrated in FIG. 2). For example, the adjustable voltage regulator may provide a gate voltage level for a field effect transistor in a load circuit (e.g., load circuit 414 illustrated in FIG. 4). In addition, the adjustable voltage regulator may receive an amplified error signal from the controller. As described in connection with FIG. 4, herein, the adjustable voltage regulator may generate a gate voltage level after receiving an amplified error signal output from a controller. In some examples, the adjustable voltage regulator may adjust a gate level voltage in response to the amplified error signal requesting more or less current.

At block 522, the method may include generating a load to conform to at least one parameter. The load may conform to at least one parameter generated by a control interface (e.g., control interface 102 illustrated in FIG. 1). A device (e.g., device 104 illustrated in FIG. 1) may receive the at least one parameter and output a load to conform to the at least one parameter. In some examples, the device may receive the at least one parameter from the microprocessor.

For example, a device may generate a load to conform to at least one parameter. The device may include a microprocessor that may receive at least one parameter from a control interface. The microprocessor may generate a reference current and/or a plurality of loads. The reference current may be transmitted to a controller, which may also receive a plurality of current monitoring signals corresponding to the loads. The controller may sum and/or average the current monitoring signals and compare them to the reference current. In some examples, the controller may output an amplified error signal if the current monitoring signals do not match the current reference. An adjustable gate voltage may receive the error signal and adjust the gate level voltage of a field effect transistor in a load circuit in response to the error signal requesting more or less current. The device may output a plurality of loads after they are adjusted to meet the specifications of the at least one parameter.

In some examples, the method may further include generating, via the microprocessor, a plurality of loads. The loads may be generated in accordance with at least one parameter. The parameters may be generated by a control interface and transmitted to a device that outputs the loads.

The method may further include generating, via the microprocessor, a slew rate. In some examples, the method may further include generating, via the microprocessor, a reference current based on an amount of current associated with the plurality of loads and the slew rate. The current of the loads generated by a microprocessor may be compared to the reference current. If the current of the loads do not match the reference current, an adjustable voltage regulator may adjust the voltage of the loads so the current feedbacks will match the reference current.

The method may further include transmitting, via the microprocessor, the reference current to a controller. The controller may be, for example, controller 210 illustrated in FIG. 2, herein. The controller may sum and/or average a plurality of loads generated by a microprocessor. If the current of the loads do not match the reference current, the controller will generate an error signal, amplify that signal, and transmit that signal to an adjustable voltage regulator.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the disclosure. As used herein, designators such as "N", etc., particularly with respect to reference numerals in the drawings, indicate that a number of the particular feature so designated can be included. A "plurality of" is intended to refer to more than one of such things.

What is claimed:

1. A system, comprising:
a control interface to generate a parameter; and
a device coupled to the control interface, wherein the device is to:
receive the parameter from the control interface;
generate a switching waveform and current reference;
adjust the switching waveform to generate an output current; and
adjust the output current by using an error amplifier to provide an output current that conforms to at least one parameter.

2. The system of claim 1, wherein the parameter comprises at least one of a switching frequency, a load slew rate, a current amplitude, a duty cycle of an output current, or combinations thereof.

3. The system of claim 1, wherein the parameter comprises a slew rate parameter that is based, at least in part, on enabling and disabling load stages.

4. The system of claim 1, wherein the parameter comprises a slew rate parameter that is further based, at least in part, on adjusting the gate resistances of field effect transistors.

5. The system of claim 1, wherein the parameter comprises a duty cycle that is based, at least in part, on a pulse width modulation (PWM) output from a microcontroller.

6. The system of claim 1, wherein the parameter comprises a current amplitude that is based, at least in part, on a reference voltage out of a microcontroller.

7. The system of claim 1, wherein an external power source provides power for a plurality of electronics and controllers on the device.

8. An apparatus, comprising:
control circuitry including:
a microprocessor to interface with a control interface;
a controller to receive a current reference from the microprocessor and a plurality of current monitoring signals from a plurality of loads;
an adjustable voltage regulator to provide a gate voltage level for a field effect transistor in a load circuit; and
a load to conform to at least one parameter.

9. The apparatus of claim 8, wherein the microprocessor:
generates a PWM signal;
transmits the PWM signal to a load circuit;
generates a plurality of loads;
generates a slew rate;
generates a reference current based on an amount of current associated with the plurality of loads and the slew rate; and
transmits the reference current to a controller.

10. The apparatus of claim 8 wherein the controller:
sums and averages current monitoring signals from a plurality of loads; and
controls the current monitoring signals to the current reference by amplifying an error output from the controller.

11. The apparatus of claim 10, wherein the amplified error output from the controller controls an output voltage of an adjustable voltage regulator.

12. The apparatus of claim 8, wherein the adjustable voltage regulator adjusts a gate voltage level for a field effect transistor in a load circuit by an amplified error signal from a controller.

13. The apparatus of claim 12, wherein the gate drive voltage level is increased or decreased based on a determination that the amplified error output requests more or less current than an amount of current supplied by the microprocessor.

14. The apparatus of claim 8, wherein the apparatus outputs a plurality of loads in accordance with the parameters generated by the control interface.

15. A method, comprising:
receiving a current reference from a microprocessor;
receiving a plurality of current monitoring signals from a plurality of loads;
providing a gate voltage level for a field effect transistor in a load circuit; and
generating a load to conform to at least one parameter.

16. The method of claim 15, comprising:
generating, via the microprocessor, a plurality of loads;
generating, via the microprocessor, a slew rate;
generating, via the microprocessor, a reference current based on an amount of current associated with the plurality of loads and the slew rate; and
transmitting, via the microprocessor, the reference current to a controller.

17. The method of claim 15, comprising:
summing and averaging, via a controller, current monitoring signals from a plurality of loads;
controlling, via the controller, the current monitoring signals to the current reference by amplifying an error output from the controller; and
outputting, via the controller, an amplified error signal to control an output voltage of an adjustable voltage regulator.

18. The method of claim 15, comprising adjusting, via an adjustable voltage regulator, a gate voltage level for a field effect transistor in a load circuit by an amplified error signal from a controller.

19. The method of claim 15, comprising increasing or decreasing the gate drive voltage level based on a determination that the amplified error output requests more or less current than an amount of current supplied by the microprocessor.

20. The method of claim 15, comprising outputting a plurality of loads in accordance with the parameters generated by the control interface.

\* \* \* \* \*